(12) United States Patent
Takeuchi

(10) Patent No.: US 9,602,078 B2
(45) Date of Patent: *Mar. 21, 2017

(54) HIGH-FREQUENCY MODULE HAVING A MATCHING ELEMENT COUPLED TO A CONNECTION UNIT

(71) Applicant: Murata Manufacturing Co., Ltd., Nagaokakyo-shi, Kyoto-fu (JP)

(72) Inventor: Morio Takeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/878,082

(22) Filed: Oct. 8, 2015

(65) Prior Publication Data
US 2016/0028365 A1    Jan. 28, 2016

Related U.S. Application Data

(63) Continuation of application No. PCT/JP2014/060246, filed on Apr. 6, 2014.

(30) Foreign Application Priority Data

Apr. 11, 2013 (JP) .................... 2013-083078

(51) Int. Cl.
| | | |
|---|---|---|
| *H03H 9/72* | (2006.01) | |
| *H03H 9/64* | (2006.01) | |
| *H03H 9/52* | (2006.01) | |
| *H03H 9/05* | (2006.01) | |
| *H04B 1/18* | (2006.01) | |
| *H03H 9/25* | (2006.01) | |
| *H03H 9/46* | (2006.01) | |
| *H03H 9/00* | (2006.01) | |

(52) U.S. Cl.
CPC .......... *H03H 9/725* (2013.01); *H03H 9/0009* (2013.01); *H03H 9/0576* (2013.01);
(Continued)

(58) Field of Classification Search
CPC .... H03H 9/6433; H03H 9/6479; H03H 9/725; H03H 9/0009; H03H 9/0057;
(Continued)

(56) References Cited

U.S. PATENT DOCUMENTS 7,230,512 B1 * 6/2007 Carpenter ................ H03H 3/08
                                                          333/133
7,385,463 B2 * 6/2008 Koga ................... H03H 9/0576
                                                          333/133
(Continued)

FOREIGN PATENT DOCUMENTS

JP         2004-080233 A      3/2004
JP         2008-118192 A      5/2008
(Continued)

OTHER PUBLICATIONS

Official Communication issued in International Patent Application No. PCT/JP2014/060246, mailed on Jun. 17, 2014.

*Primary Examiner* — Robert Pascal
*Assistant Examiner* — Jorge Salazar, Jr.
(74) *Attorney, Agent, or Firm* — Keating & Bennett, LLP

(57) ABSTRACT

A high-frequency module includes a filter unit and first and second external connection terminals. The filter unit includes first and second terminals and a plurality of SAW resonators. The plurality of SAW resonators are connected to one another by connection conductors. A matching element is connected between the first terminal and the first external connection terminal, and a matching element is connected between the second terminal and the second external connection terminal. At least one of the matching elements is inductively coupled or capacitively coupled to at least one of the connection conductors located at a position such that at least one of the SAW resonators is interposed between the matching element and the connection conductor.

19 Claims, 9 Drawing Sheets

(52) U.S. Cl.
CPC ............... *H03H 9/25* (2013.01); *H03H 9/46* (2013.01); *H03H 9/52* (2013.01); *H03H 9/64* (2013.01); *H03H 9/6423* (2013.01); *H03H 9/6433* (2013.01); *H03H 9/6479* (2013.01); *H03H 9/6489* (2013.01); *H04B 1/18* (2013.01); *H03H 9/0057* (2013.01)

(58) Field of Classification Search
CPC .... H03H 9/605; H03H 9/6483; H03H 9/6423; H03H 9/1092; H03H 9/64; H03H 9/6489; H03H 9/46; H03H 9/52; H03H 9/25; H03H 9/0576; H04B 1/18
USPC .................................. 333/133, 193–196, 187
See application file for complete search history.

(56) References Cited

U.S. PATENT DOCUMENTS

| | | | | |
|---|---|---|---|---|
| 7,808,935 | B2* | 10/2010 | Koga | H01P 1/213 333/132 |
| 7,978,019 | B2* | 7/2011 | Wiesbauer | H01P 1/213 333/12 |
| 8,138,854 | B2* | 3/2012 | Hara | H03H 9/0028 333/126 |
| 2003/0058066 | A1* | 3/2003 | Taniguchi | H03H 9/0557 333/193 |
| 2004/0227585 | A1 | 11/2004 | Taniguchi et al. | |
| 2008/0218927 | A1* | 9/2008 | Harada | H03H 7/463 361/119 |
| 2009/0051457 | A1* | 2/2009 | Bauer | H03H 9/0071 333/4 |
| 2009/0058555 | A1 | 3/2009 | Takata et al. | |
| 2012/0119847 | A1 | 5/2012 | Iwaki et al. | |
| 2012/0286896 | A1* | 11/2012 | Takamine | H03H 9/6483 333/133 |
| 2014/0118084 | A1 | 5/2014 | Takemura | |

FOREIGN PATENT DOCUMENTS

| | | |
|---|---|---|
| JP | 2008-245310 A | 10/2008 |
| JP | 2009-290606 A | 12/2009 |
| JP | 2012-109818 A | 6/2012 |
| WO | 2007/145049 A1 | 12/2007 |
| WO | 2011/089746 A1 | 7/2011 |
| WO | 2013/008435 A1 | 1/2013 |

* cited by examiner

◄- - - - -► : INDUCTIVE COUPLING

◄- - - - -► : INDUCTIVE COUPLING

HIGH-FREQUENCY MODULE HAVING A MATCHING ELEMENT COUPLED TO A CONNECTION UNIT

BACKGROUND OF THE INVENTION

1. Field of the Invention

The present invention relates to a high-frequency module including a plurality of filter elements.

2. Description of the Related Art

Mobile devices and the like having a wireless communication function include a filter circuit to transmit only high-frequency signals having a desired frequency and to attenuate high-frequency signals having frequencies other than the desired frequency.

For example, Japanese Unexamined Patent Application Publication No. 2012-109818 describes a filter circuit including a plurality of SAW filters. Specifically, the filter circuit in Japanese Unexamined Patent Application Publication No. 2012-109818 has an input terminal and an output terminal between which a plurality of SAW filters are connected in series with each other. Respective SAW filters are also connected between a connection line that connects the series connected SAW filters to each other and ground.

In the filter circuit described in Japanese Unexamined Patent Application Publication No. 2012-109818, an inductor or a series circuit including an inductor and a capacitor (referred to as a correction circuit) is connected in parallel to the series circuit of SAW filters in order to improve attenuation characteristics outside a pass band. In this case, the correction circuit is adjusted so that a high-frequency signal (a signal to be suppressed) outside the pass band which propagates through a circuit unit composed of SAW filters and a signal to be suppressed which propagates through the correction circuit have the same amplitude and opposite phases. Thus, the signals to be suppressed are canceled at a connection node between the circuit unit composed of SAW filters and the correction circuit, and are not output from the output terminal.

However, the configuration described above requires a correction circuit composed of an inductor or a series circuit including an inductor and a capacitor, separately from a main circuit unit composed of SAW filters having a filter function, only in order to improve attenuation characteristics.

Accordingly, the filter circuit has a large number of components, resulting in an increase in the size of the filter circuit, which is not suitable for current mobile terminals and the like where compactness is required.

SUMMARY OF THE INVENTION

Preferred embodiments of the present invention provide a high-frequency module including a compact filter circuit that is excellent in attenuation characteristics outside a pass band.

According to a preferred embodiment of the present invention, a high-frequency module includes a first external connection terminal, a second external connection terminal, a filter unit connected between the first external connection terminal and the second external connection terminal, and a matching element connected between at least one of the first external connection terminal or the second external connection terminal and the filter unit, and includes the following features.

The filter unit includes a first terminal that connects to the first external connection terminal, a second terminal that connects to the second external connection terminal, and a plurality of filter elements connected in series with each other between the first terminal and the second terminal. The matching element is inductively coupled or capacitively coupled to at least one of a connection unit at one end that connects a filter element at one end among the plurality of filter elements to the first terminal, a connection unit at another end that connects a filter element at another end among the plurality of filter elements to the second terminal, and an intermediate connection unit that connects adjacent filter elements to each other.

In this configuration, a sub-propagation path that extends through a path of inductive coupling or capacitive coupling produced by a connection unit and a matching element is separate from a main propagation path along which a high-frequency signal propagates through a plurality of filter units. The sub-propagation path has amplitude characteristics and phase characteristics different from those of the main propagation path in accordance with a degree of inductive coupling or capacitive coupling. By adjusting the amplitude characteristics and phase characteristics of the sub-propagation path, the transmission characteristics of the high-frequency module are adjusted. Accordingly, the transmission characteristics of the high-frequency module is able to be adjusted without using any additional inductor or capacitor, and, for example, attenuation characteristics are improved.

In addition, a high-frequency module according to a preferred embodiment of the present invention preferably has the following configuration. The connection unit and the matching element that are inductively coupled or capacitively coupled to each other are inductively coupled or capacitively coupled to each other so that an impedance outside a pass band of the filter unit changes.

As provided in this configuration, appropriately adjusting the method of coupling and the degree of coupling causes characteristics outside the passband, or attenuation characteristics, to be changed without any change in the characteristics of the pass band.

Further, a high-frequency module according to a preferred embodiment of the present invention preferably has the following configuration. The connection unit and the matching element that are inductively coupled or capacitively coupled to each other are inductively coupled or capacitively coupled to each other so that an attenuation pole frequency outside the pass band of the filter unit changes.

In this configuration, as the method of adjustment of the attenuation characteristics, the attenuation pole frequency is adjusted.

In a high-frequency module according to a preferred embodiment of the present invention, the matching element may be a series-connected matching element that is connected in series between the first external connection terminal and the first terminal or that is connected in series between the second external connection terminal and the second terminal.

In a high-frequency module according to a preferred embodiment of the present invention, the matching element may be a shunt-connected matching element that is connected between a connection line which connects the first external connection terminal and the first terminal to each other and ground or that is connected between a connection line which connects the second external connection terminal and the second terminal to each other and ground.

The configurations described above provide specific connection methods of the matching element. By appropriately determining either of these connection methods, it is possible to also appropriately adjust the attenuation characteristics described above while performing appropriate impedance matching between the filter unit and an external unit.

In a high-frequency module according to a preferred embodiment of the present invention, the connection units are preferably constituted by linear conductive patterns.

In this configuration, the connection units are implemented with a simple structure, and the filter unit and the high-frequency module are compact.

In addition, a high-frequency module according to a preferred embodiment of the present invention may further include a third terminal and a second filter unit, and the second filter unit may be connected between a connection line which connects the first terminal to a filter element to be connected to the first terminal and the third terminal.

This configuration provides a duplexer including the first terminal as a common terminal and the second terminal and the third terminal as individual terminals.

In addition, a high-frequency module according to a preferred embodiment of the present invention may have the following configuration. The high-frequency module further includes a flat-plate-shaped filter substrate including a first principal surface on which an IDT electrode constituting the filter unit and the connection units are provided, a flat-plate-shaped cover layer that faces the first principal surface of the filter substrate with a space between the cover layer and the first principal surface of the filter substrate, a connection electrode having a shape that projects from the first principal surface and penetrates through the cover layer, and a multi-layer substrate having the matching element mounted or formed thereon. The filter substrate is located so that the first principal surface is oriented toward a mounting surface of the multi-layer substrate. The filter substrate is connected to the multi-layer substrate via the connection electrode.

In this configuration, a high-frequency module is able to be implemented using a WLP (Wafer Level Package) filter unit and a multi-layer substrate. Thus, the high-frequency module is made compact.

In addition, a high-frequency module according to a preferred embodiment of the present invention may have the following configuration. The matching element is a mount-type element to be mounted on the mounting surface of the multi-layer substrate. The connection unit is located on the first principal surface of the filter substrate near a first side of the filter substrate. The mount-type element is mounted near the first side of the filter substrate.

This configuration provides a specific example configuration of a high-frequency module that uses WLP in a case where the matching element is a mount-type element. The configuration described above ensures that coupling of the matching element and a connection unit is achieved.

Further, a high-frequency module according to a preferred embodiment of the present invention preferably has the following configuration. The matching element includes a rectangular parallelepiped housing, and a spiral conductor provided in the housing and having a substantially rectangular outer peripheral shape in plan view. The matching element is located so that a long side of the housing is parallel or substantially parallel to the first side of the filter substrate.

This configuration facilitates the coupling between the matching element and a connection unit, and makes it easy to adjust the amount of coupling to the desired value.

In addition, a high-frequency module according to a preferred embodiment of the present invention may have the following configuration. The matching element is constituted by a conductive pattern provided on the mounting surface of the multi-layer substrate or a conductive pattern provided in the multi-layer substrate, and the conductive pattern and the connection unit at least partially overlap each other in plan view.

This configuration provides a specific example configuration of a high-frequency module that uses WLP in a case where the matching element is constituted by a conductive pattern provided on or provided in the multi-layer substrate. The configuration described above ensures that coupling of the matching element and a connection unit is achieved. In addition, since the matching element is not configured to be mounted on the multi-layer substrate as a mount-type circuit element, a planar space for mounting the matching element is not required, which can result in a reduction in the shape and size of the high-frequency module in plan view.

In addition, a high-frequency module according to a preferred embodiment of the present invention may have the following configuration. The high-frequency module further includes a flat-plate-shaped filter substrate including a first principal surface on which an IDT electrode constituting the filter unit and the connection units are provided, and a flat-plate-shaped filter-mounting substrate located on the first principal surface side of the filter substrate, to which the first principal surface of the filter substrate is mounted. The matching element is provided on the filter-mounting substrate.

This configuration provides a case where the high-frequency module is implemented by CSP (Chip Sized Package).

According to various preferred embodiments of the present invention, a high-frequency module including a compact filter circuit that is excellent in attenuation characteristics outside a pass band is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
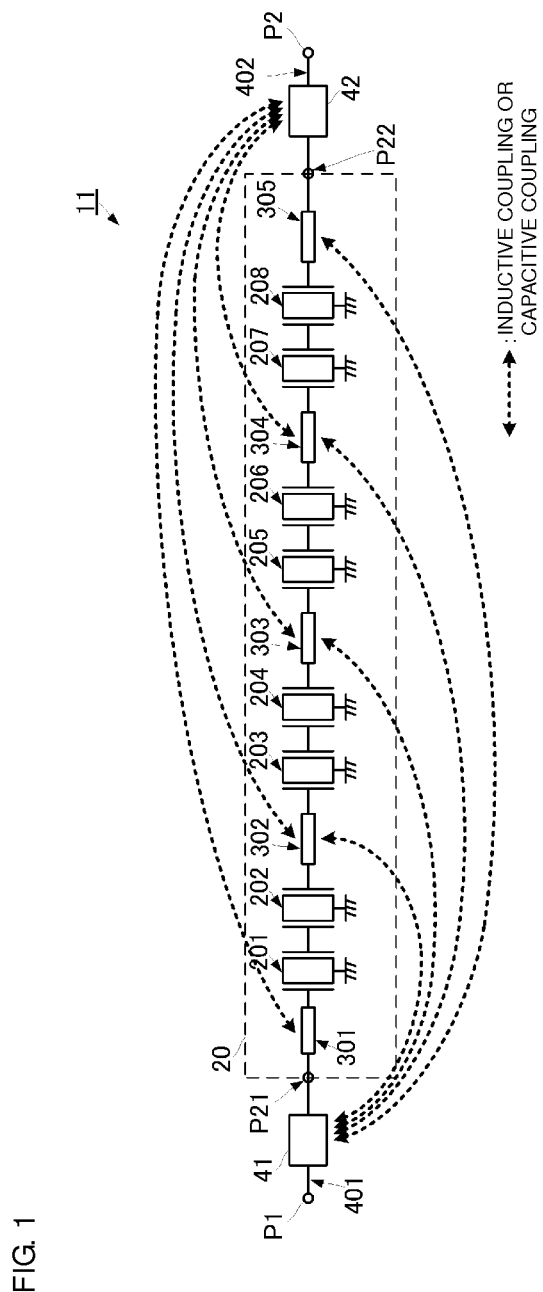
FIG. 1 is a circuit block diagram illustrating a first example circuit of a high-frequency module according to a preferred embodiment of the present invention.
Figure 2:
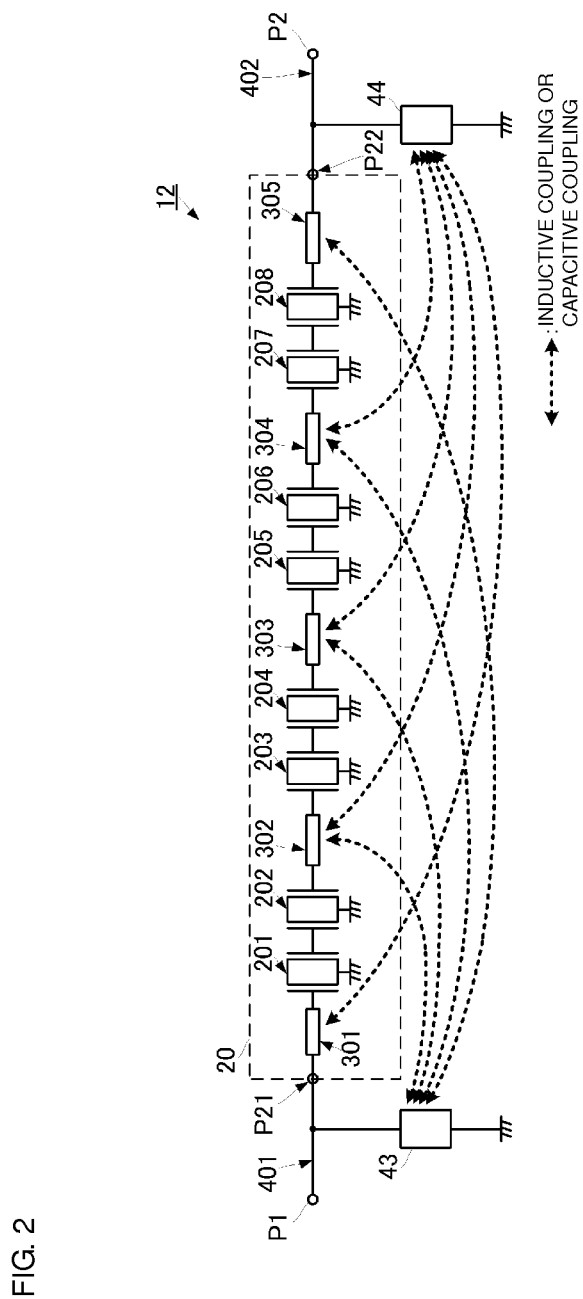
FIG. 2 is a circuit block diagram illustrating a second example circuit of a high-frequency module according to a preferred embodiment of the present invention.
Figure 3:
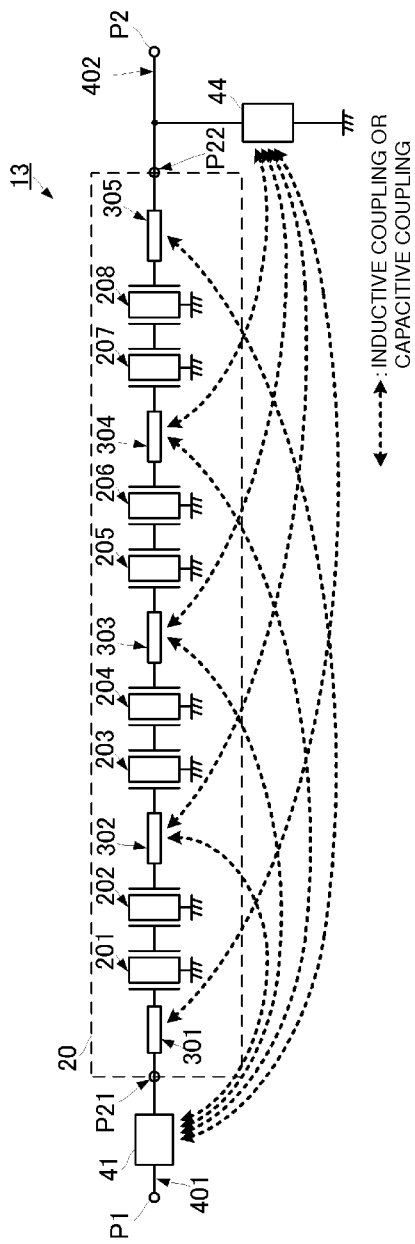
FIG. 3 is a circuit block diagram illustrating a third example circuit of a high-frequency module according to a preferred embodiment of the present invention.
Figure 4:
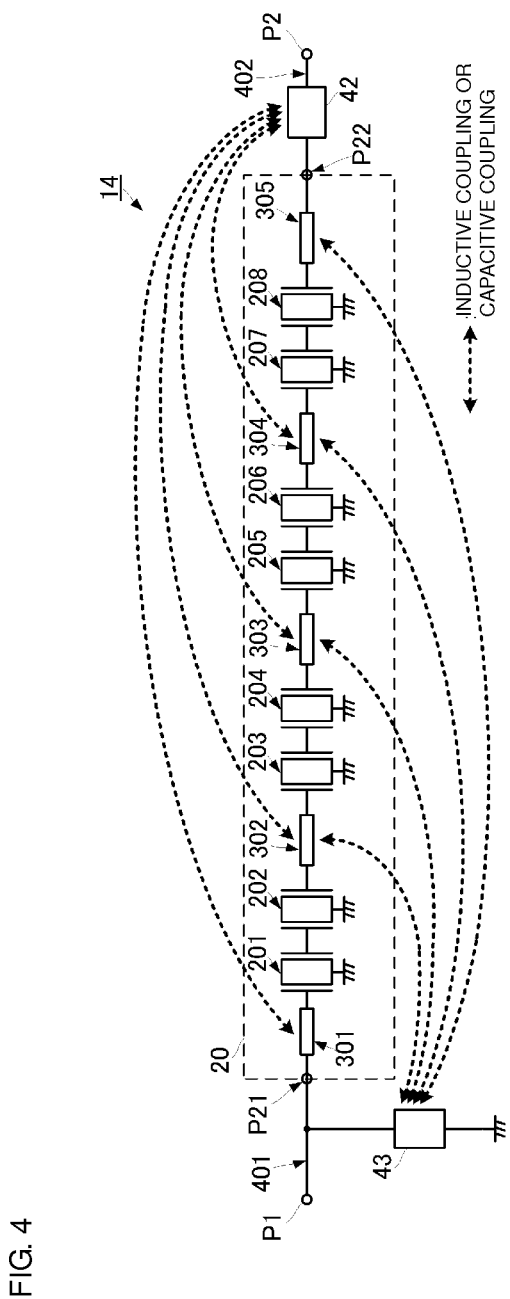
FIG. 4 is a circuit block diagram illustrating a fourth example circuit of a high-frequency module according to a preferred embodiment of the present invention.
Figure 5A:
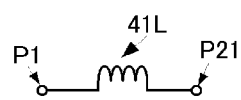
FIGS. 5A-5H illustrate circuit diagrams depicting specific examples of a matching element of the high-frequency modules illustrated in FIG. 1 to FIG. 4.
Figure 5B:
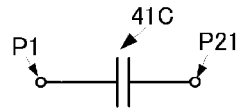
Figure 5C:
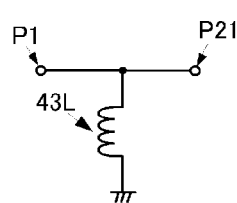
Figure 5D:
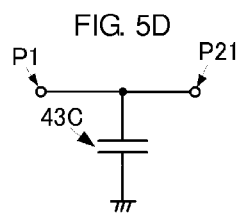
Figure 5E:
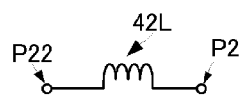
Figure 5F:
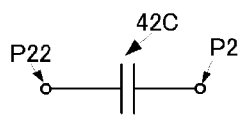
Figure 5G:
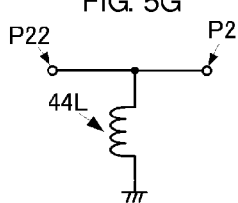
Figure 5H:
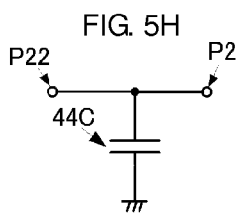

A high-frequency module according to a preferred embodiment of the present invention will be described with reference to the drawings. FIG. 1 is a circuit block diagram illustrating a first example circuit of a high-frequency module according to a preferred embodiment of the present invention. FIG. 2 is a circuit block diagram illustrating a second example circuit of a high-frequency module according to a preferred embodiment of the present invention. FIG. 3 is a circuit block diagram illustrating a third example circuit of a high-frequency module according to a preferred embodiment of the present invention. FIG. 4 is a circuit block diagram illustrating a fourth example circuit of a high-frequency module according to a preferred embodiment of the present invention. FIG. 5A, FIG. 5B, FIG. 5C, and FIG. 5D are circuit diagrams illustrating specific examples of a matching element on the first external connection terminal side. FIG. 5E, FIG. 5F, FIG. 5G, and FIG. 5H are circuit diagrams illustrating specific examples of a matching element on the second external connection terminal side.

First, a common circuit configuration of high-frequency modules 11, 12, 13, and 14 illustrated in FIG. 1 to FIG. 4, respectively, will be described.

The high-frequency modules 11, 12, 13, and 14 each include a first external connection terminal P1, a second external connection terminal P2, and a filter unit 20. The filter unit 20 is connected between the first external connection terminal P1 and the second external connection terminal P2.

The filter unit 20 includes a first terminal P21 and a second terminal P22. The first terminal P21 is connected to the first external connection terminal P1 with a series-connected matching element or shunt-connected matching element described below interposed therebetween. The second terminal P22 is connected to the second external connection terminal P2 with a series-connected matching element or shunt-connected matching element described below interposed therebetween.

The filter unit 20 includes a plurality of SAW resonators 201, 202, 203, 204, 205, 206, 207, and 208 (hereinafter referred to simply as the plurality of SAW resonators 201-208 in order to collectively describe a plurality of SAW resonators). These SAW resonators correspond to "filter elements".

The plurality of SAW resonators 201-208 define and function as band-pass filters (BPFs) each having a resonant frequency and each having individual band-pass characteristics. The plurality of SAW resonators 201-208 are connected in series with each other between the first terminal P21 and the second terminal P22.

More specifically, one end of the SAW resonator 201 is connected to the first terminal P21 via a connection conductor 301. The other end of the SAW resonator 201 is connected to one end of the SAW resonator 202.

The other end of the SAW resonator 202 is connected to one end of the SAW resonator 203 via a connection conductor 302. The other end of the SAW resonator 203 is connected to one end of the SAW resonator 204.

The other end of the SAW resonator 204 is connected to one end of the SAW resonator 205 via a connection conductor 303. The other end of the SAW resonator 205 is connected to one end of the SAW resonator 206.

The other end of the SAW resonator 206 is connected to one end of the SAW resonator 207 via a connection conductor 304. The other end of the SAW resonator 207 is connected to one end of the SAW resonator 208.

The other end of the SAW resonator 208 is connected to the second terminal P22 via a connection conductor 305.

The connection between the SAW resonators 201 and 202, the connection between the SAW resonators 203 and 204, the connection between the SAW resonators 205 and 206, and the connection between the SAW resonators 207 and 208 are not specifically referred to here as connection conductors, but can be regarded as connection conductors if the connections are performed using a transmission path having certain lengths. These connection conductors correspond to "connection units".

By combining the band-pass characteristics and attenuation characteristics of the SAW resonators 201-208, the filter unit 20 implements desired band-pass characteristics and attenuation characteristics outside the pass band as the filter unit 20.

In the common circuit configuration of the high-frequency modules 11, 12, 13, and 14 described above, specifically, each high-frequency module has the following circuit configuration.

First Example Circuit

The high-frequency module 11 illustrated in FIG. 1 includes series-connected matching elements 41 and 42. One of the matching elements 41 and 42 can be omitted.

The matching element 41 is connected between the first terminal P21 of the filter unit 20 and the first external connection terminal P1. Specifically, the matching element 41 is an inductor 41L illustrated in FIG. 5A which is connected in series between the first terminal P21 and the first external connection terminal P1, or a capacitor 41C illustrated in FIG. 5B which is connected in series between the first terminal P21 and the first external connection terminal P1. The element value (inductance or capacitance) of the matching element 41 is set to an element value that achieves impedance matching between a circuit connected to the first external connection terminal P1 side and the filter unit 20.

The matching element 42 is connected between the second terminal P22 of the filter unit 20 and the second external connection terminal P2. Specifically, the matching element 42 is an inductor 42L illustrated in FIG. 5E which is connected in series between the second terminal P22 and the second external connection terminal P2, or a capacitor 42C illustrated in FIG. 5F which is connected in series between the second terminal P22 and the second external connection terminal P2. The element value (inductance or capacitance) of the matching element 42 is set to an element value that achieves impedance matching between a circuit connected to the second external connection terminal P2 side and the filter unit 20.

In addition, as indicated by dotted-line arrows in FIG. 1, at least one of the matching elements 41 and 42 is inductively coupled or capacitively coupled to at least one of the connection conductors 301, 302, 303, 304, and 305 of the filter unit 20. In this case, a matching element and a connection conductor located at positions between which at least one SAW resonator is interposed are coupled to each other.

More specifically, the matching element 41 is coupled to at least one of the connection conductors 302, 303, 304, and 305. For example, if the matching element 41 is the inductor 41L, the inductor 41L is inductively coupled or capacitively coupled to at least one of the connection conductors 302, 303, 304, and 305. If the matching element 41 is the capacitor 41C, the capacitor 41C is capacitively coupled to at least one of the connection conductors 302, 303, 304, and 305.

The matching element 42 is coupled to at least one of the connection conductors 301, 302, 303, and 304. If the matching element 42 is the inductor 42L, the inductor 42L is inductively coupled or capacitively coupled to at least one of the connection conductors 301, 302, 303, and 304. If the matching element 42 is the capacitor 42C, the capacitor 42C is capacitively coupled to at least one of the connection conductors 301, 302, 303, and 304.

With the configuration described above, a connection conductor and a matching element to be coupled to each other are connected in terms of high frequency. For example, if the matching element 41 is the inductor 41L and the inductor 41L is inductively coupled to the connection conductor 304, an inductive coupling circuit having a mutual inductance M is provided between the inductor 41L (the matching element 41) and the connection conductor 304. Thus, high-frequency signals are not propagated only through a main propagation path defined by the filter unit 20 as a path of propagation between the first external connection terminal P1 and the second external connection terminal P2, but some high-frequency signals are also propagated through a sub-propagation path defined by the inductor 41L (the matching element 41), the inductive coupling circuit, and the connection conductor 304 as a path of propagation.

Accordingly, the high-frequency module 11 has combined transmission characteristics in which the transmission characteristics of the main propagation path and the transmission characteristics of the sub-propagation path are combined.

Here, by adjusting the method of coupling of a matching element and a connection conductor to be coupled to each other and the degree of coupling between them, the amplitude and phase of a high-frequency signal that propagates through the sub-propagation path are adjusted. In other words, the transmission characteristics of the sub-propagation path are able to be adjusted. Examples of the transmission characteristics include attenuation characteristics (amplitude characteristics) and phase characteristics.

Further, adjusting the method of coupling and the degree of coupling provides a sub-propagation path on only the attenuation characteristics outside the pass band, substantially without having an effect on the transmission characteristics for the frequency band of the high-frequency signal (desired high-frequency signal) to be transmitted through the high-frequency module 11.

In addition, by adjusting the transmission characteristics of the sub-propagation path in the way described above, the transmission characteristics of the high-frequency module 11 are able to be adjusted. For example, as described below, the attenuation characteristics outside the pass band are able to be adjusted.

In this case, unlike the configuration of the related art, no additional inductor or capacitor is required to adjust the transmission characteristics of a high-frequency filter. Thus, a high-frequency filter having the desired attenuation characteristics with a simple configuration is provided. Accordingly, the high-frequency filter is able to be made compact.

In addition, a mutual induction component caused by the coupling described above increases the effective inductance value of the inductor 41L (the matching element 21). This also further reduces the line length of the inductor 41L.

Second Example Circuit

The high-frequency module 12 illustrated in FIG. 2 includes shunt-connected matching elements 43 and 44. One of the matching elements 43 and 44 can be omitted.

The matching element 43 is connected between a connection line 401 that connects the first terminal P21 of the filter unit 20 and the first external connection terminal P1 to each other and ground. Specifically, the matching element 43 is an inductor 43L illustrated in FIG. 5C which is connected between the connection line 401 that connects the first terminal P21 and the first external connection terminal P1 to each other and ground, or a capacitor 43C illustrated in FIG. 5D which is connected between the connection line 401 that connects the first terminal P21 and the first external connection terminal P1 to each other and ground. The element value (inductance or capacitance) of the matching element 43 is set to an element value that achieves impedance matching between a circuit connected to the first external connection terminal P1 side and the filter unit 20.

The matching element 44 is connected between a connection line 402 that connects the second terminal P22 of the filter unit 20 and the second external connection terminal P2 to each other and ground. Specifically, the matching element 44 is an inductor 44L illustrated in FIG. 5G which is connected between the connection line 402 that connects the second terminal P22 and the second external connection terminal P2 to each other and ground, or a capacitor 44C illustrated in FIG. 5H which is connected between the connection line 402 that connects the second terminal P22 and the second external connection terminal P2 to each other and ground. The element value (inductance or capacitance) of the matching element 44 is set to an element value that achieves impedance matching between a circuit connected to the second external connection terminal P2 side and the filter unit 20.

In addition, as indicated by dotted-line arrows in FIG. 2, at least one of the matching elements 43 and 44 is inductively coupled or capacitively coupled to at least one of the connection conductors 301, 302, 303, 304, and 305 of the filter unit 20. In this case, a matching element and a connection conductor located at positions between which at least one SAW resonator is interposed are coupled to each other.

More specifically, the matching element 43 is coupled to at least one of the connection conductors 302, 303, 304, and 305. If the matching element 43 is the inductor 43L, the inductor 43L is inductively coupled or capacitively coupled to at least one of the connection conductors 302, 303, 304, and 305. If the matching element 43 is the capacitor 43C, the capacitor 43C is capacitively coupled to at least one of the connection conductors 302, 303, 304, and 305.

The matching element 44 is coupled to at least one of the connection conductors 301, 302, 303, and 304. If the matching element 44 is the inductor 44L, the inductor 44L is inductively coupled or capacitively coupled to at least one of the connection conductors 301, 302, 303, and 304. If the matching element 44 is the capacitor 44C, the capacitor 44C is capacitively coupled to at least one of the connection conductors 301, 302, 303, and 304.

With the configuration described above, a connection conductor and a matching element to be coupled to each other are connected in terms of high frequency. For example, if the matching element 44 is the capacitor 44C and the capacitor 44C is capacitively coupled to the connection conductor 301, a capacitive coupling circuit having a coupling capacitance $C_M$ is generated between the capacitor 44C (the matching element 44) and the connection conductor 301. Thus, high-frequency signals are not propagated only through a main propagation path defined by the filter unit 20 as a path of propagation between the first external connection terminal P1 and the second external connection terminal P2, but some high-frequency signals are also propagated through a sub-propagation path defined by the connection conductor 301, the capacitive coupling circuit, and the capacitor 44C (the matching element 44) as a path of propagation.

Accordingly, the high-frequency module 12 has combined transmission characteristics in which the transmission characteristics of the main propagation path and the transmission characteristics of the sub-propagation path are combined.

Similarly to the high-frequency module 11 described above, the high-frequency module 12 having the configuration described above also achieves the desired attenuation characteristics with a simpler configuration than the configuration of the related art.

Third Example Circuit

The high-frequency module 13 illustrated in FIG. 3 includes a series-connected matching element 41 and a shunt-connected matching element 44.

The matching element 41 is connected between the first terminal P21 of the filter unit 20 and the first external connection terminal P1. Specifically, the matching element 41 is the inductor 41L illustrated in FIG. 5A which is connected in series between the first terminal P21 and the first external connection terminal P1, or the capacitor 41C illustrated in FIG. 5(B) which is connected in series between the first terminal P21 and the first external connection terminal P1. The element value (inductance or capacitance) of the matching element 41 is set to an element value that achieves impedance matching between a circuit connected to the first external connection terminal P1 side and the filter unit 20.

The matching element 44 is connected between a connection line 402 that connects the second terminal P22 of the filter unit 20 and the second external connection terminal P2 to each other and ground. Specifically, the matching element 44 is the inductor 44L illustrated in FIG. 5G which is connected between the connection line 402 that connects the second terminal P22 and the second external connection terminal P2 to each other and ground, or the capacitor 44C illustrated in FIG. 5H which is connected between the connection line 402 that connects the second terminal P22 and the second external connection terminal P2 to each other and ground. The element value (inductance or capacitance) of the matching element 44 is set to an element value that achieves impedance matching between a circuit connected to the second external connection terminal P2 side and the filter unit 20.

In addition, as indicated by dotted-line arrows in FIG. 3, at least one of the matching elements 41 and 44 is inductively coupled or capacitively coupled to at least one of the connection conductors 301, 302, 303, 304, and 305 of the filter unit 20. In this case, a matching element and a connection conductor located at positions between which at least one SAW resonator is interposed are coupled to each other.

More specifically, the matching element 41 is coupled to at least one of the connection conductors 302, 303, 304, and 305. If the matching element 41 is the inductor 41L, the inductor 41L is inductively coupled or capacitively coupled to at least one of the connection conductors 302, 303, 304, and 305. If the matching element 41 is the capacitor 41C, the capacitor 41C is capacitively coupled to at least one of the connection conductors 302, 303, 304, and 305.

The matching element 44 is coupled to at least one of the connection conductors 301, 302, 303, and 304. If the matching element 44 is the inductor 44L, the inductor 44L is inductively coupled or capacitively coupled to at least one of the connection conductors 301, 302, 303, and 304. If the matching element 44 is the capacitor 44C, the capacitor 44C is capacitively coupled to at least one of the connection conductors 301, 302, 303, and 304.

Accordingly, the high-frequency module 13 has combined transmission characteristics in which the transmission characteristics of a main propagation path extending through the filter unit 20 and the transmission characteristics of a sub-propagation path extending through a coupling unit are combined. Similarly to the high-frequency modules 11 and 12 described above, the high-frequency module 13 having the configuration described above also achieves the desired attenuation characteristics with a simpler configuration than the configuration of the related art.

Fourth Example Circuit

The high-frequency module 14 illustrated in FIG. 4 includes a shunt-connected matching element 42 and a series-connected matching element 43.

The matching element 42 is connected between the second terminal P22 of the filter unit 20 and the second external connection terminal P2. Specifically, the matching element 42 is the inductor 42L illustrated in FIG. 5E which is connected in series between the second terminal P22 and the second external connection terminal P2, or the capacitor 42C illustrated in FIG. 5F which is connected in series between the second terminal P22 and the second external connection terminal P2. The element value (inductance or capacitance) of the matching element 42 is set to an element value that achieves impedance matching between a circuit connected to the second external connection terminal P2 side and the filter unit 20.

The matching element 43 is connected between a connection line 401 that connects the first terminal P21 of the filter unit 20 and the first external connection terminal P1 to each other and ground. Specifically, the matching element 43 is the inductor 43L illustrated in FIG. 5C which is connected between the connection line 401 that connects the first terminal P21 and the first external connection terminal P1 to each other and ground, or the capacitor 43C illustrated in FIG. 5D which is connected between the connection line 401 that connects the first terminal P21 and the first external connection terminal P1 to each other and ground. The element value (inductance or capacitance) of the matching element 43 is set to an element value that achieves impedance matching between a circuit connected to the first external connection terminal P1 side and the filter unit 20.

In addition, as indicated by dotted-line arrows of FIG. 4, at least one of the matching elements 42 and 43 is inductively coupled or capacitively coupled to at least one of the connection conductors 301, 302, 303, 304, and 305 of the filter unit 20. In this case, a matching element and a connection conductor located at positions between which at least one SAW resonator is interposed are coupled to each other.

More specifically, the matching element 42 is coupled to at least one of the connection conductors 301, 302, 303, and 304. If the matching element 42 is the inductor 42L, the inductor 42L is inductively coupled or capacitively coupled to at least one of the connection conductors 301, 302, 303, and 304. If the matching element 42 is the capacitor 42C, the capacitor 42C is capacitively coupled to at least one of the connection conductors 301, 302, 303, and 304.

The matching element 43 is coupled to at least one of the connection conductors 302, 303, 304, and 305. If the matching element 43 is the inductor 43L, the inductor 43L is inductively coupled or capacitively coupled to at least one of the connection conductors 302, 303, 304, and 305. If the matching element 43 is the capacitor 43C, the capacitor 43C is capacitively coupled to at least one of the connection conductors 302, 303, 304, and 305.

Accordingly, the high-frequency module 14 has combined transmission characteristics in which the transmission characteristics of a main propagation path extending through the filter unit 20 and the transmission characteristics of a sub-propagation path extending through a coupling unit are combined. Similarly to the high-frequency modules 11, 12, and 13 described above, the high-frequency module 14 having the configuration described above also achieves the desired attenuation characteristics with a simpler configuration than the configuration of the related art.

Figure 6:
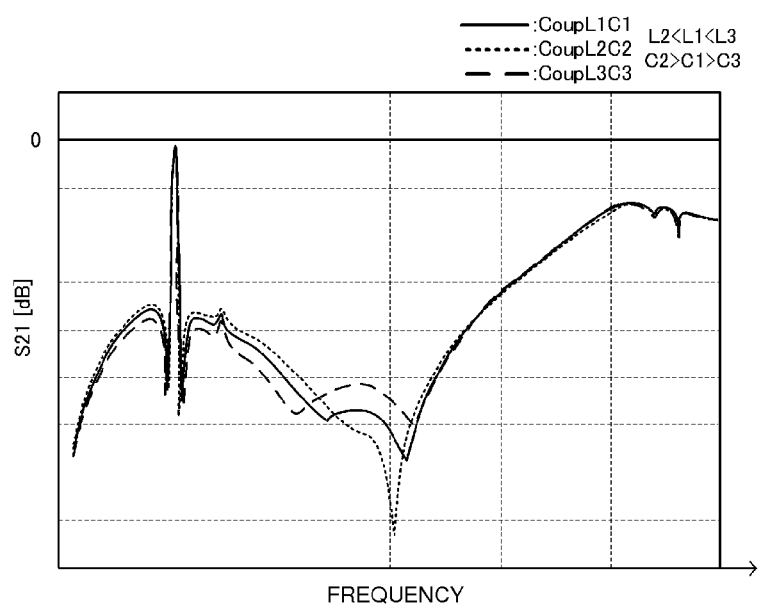
FIG. 6 is a graph illustrating a change in the bandpass characteristics of a high-frequency module when the degree of coupling between a matching element and a connection conductor changes.

FIG. 6 is a graph illustrating a change in the bandpass characteristics of a high-frequency module when the degree of coupling between a matching element and a connection conductor changes. The horizontal axis in FIG. 6 represents frequency, and the vertical axis in FIG. 6 represents the attenuation of a signal propagated from the first external connection terminal P1 to the second external connection terminal P2. Characteristics represented by the dotted line illustrated in FIG. 6 exhibit weaker inductive coupling and stronger capacitive coupling than characteristics represented by the solid line. Characteristics represented by the broken line illustrated in FIG. 6 exhibit stronger inductive coupling and weaker capacitive coupling than the characteristics represented by the solid line. Note that the characteristics illustrated in FIG. 6 are obtained when a ladder structure is used in which a SAW resonator is connected between the connecting position of the SAW resonators 202 and 203 of the filter unit 20 and ground, a SAW resonator is connected between the connecting position of the SAW resonators 204 and 205 and ground, and a SAW resonator is connected between the connecting position of the SAW resonators 206 and 207 and ground. The high-frequency module in this preferred embodiment preferably is a band pass filter whose pass band is the 800 MHz band, for example.

As illustrated in FIG. 6, as the inductive coupling becomes strong and the capacitive coupling becomes weak, the frequency of the attenuation pole that appears on the high-frequency side of the pass band becomes high. In contrast, as the inductive coupling becomes weak and the capacitive coupling becomes strong, the frequency of the attenuation pole that appears on the high-frequency side of the pass band becomes low. In FIG. 6, the frequency of the attenuation pole refers to a peak frequency substantially at the center of the frequency axis.

In addition, appropriately setting the inductive coupling and the capacitive coupling can change the attenuation characteristics on the high-frequency side of the pass band. For example, as the capacitive coupling becomes strong and the inductive coupling becomes weak, the attenuation around the pass band decreases, whereas a large attenuation is obtained at the frequency of the attenuation pole. In addition, as the capacitive coupling becomes weak and the inductive coupling becomes strong, a larger attenuation is obtained around the pass band.

As illustrated in FIG. 6, furthermore, the frequency position and the frequency width of the pass band and the insertion loss at the pass band are not substantially changed without being substantially affected by the strength of the inductive coupling and capacitive coupling.

Accordingly, by appropriately adjusting the method of coupling and the degree of coupling using the configuration of this preferred embodiment, the attenuation characteristics on the high-frequency side to the desired characteristics is able to be adjusted without any change in the characteristics of the pass band. In other words, a high-frequency module having the desired pass-band characteristics and attenuation characteristics is provided.

Figure 7:
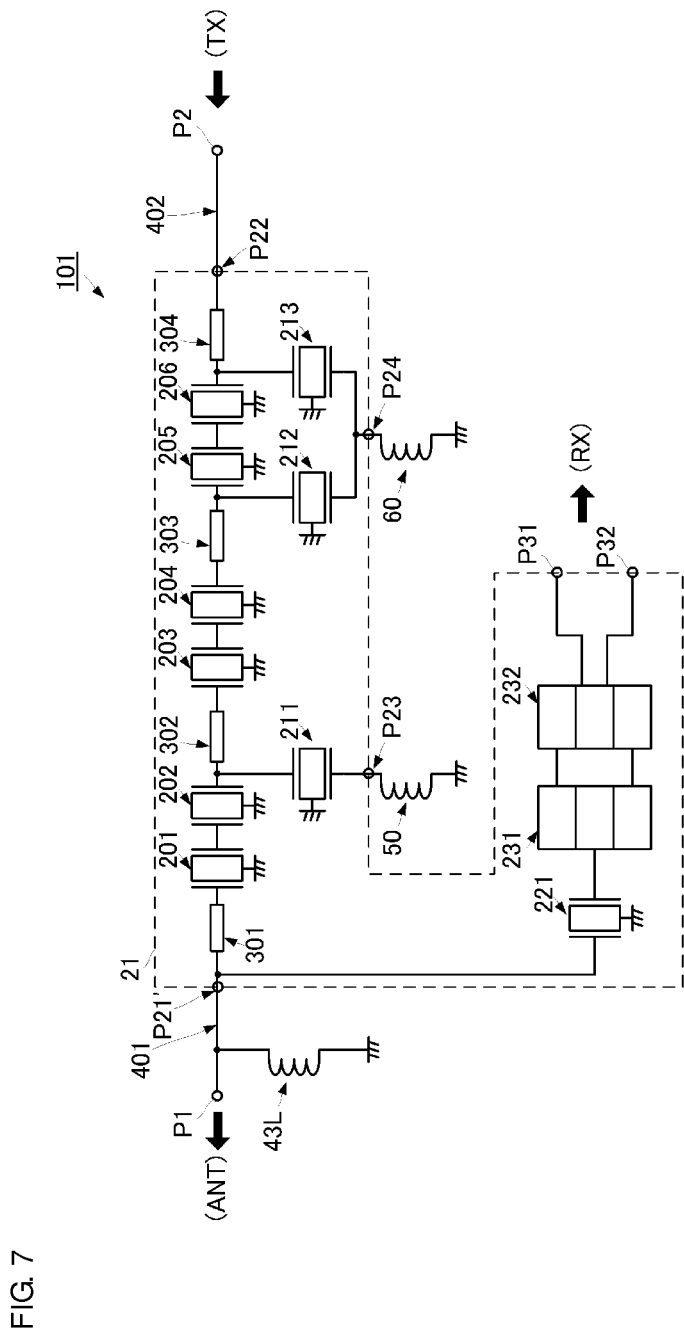
FIG. 7 is an equivalent circuit diagram of a high-frequency module having a duplexer configuration.

A high-frequency module having the configuration described above can be used in a duplexer configuration illustrated in FIG. 7 as a specific application example. FIG. 7 is an equivalent circuit diagram of a high-frequency module having a duplexer configuration.

A high-frequency module 101 includes a filter unit 21, a first external connection terminal P1, a second external connection terminal P2, and a third external connection terminal serving also as third terminals P31 and P32 of the filter unit 21. In a specific application example, the first external connection terminal P1 is connected to an antenna. The second external connection terminal P2 is connected to a transmitting circuit. The third external connection terminal (the third terminals P31 and P32) is connected to a receiving circuit.

The filter 21 includes a first terminal P21', a second terminal P22, the third terminals P31 and P32, a fourth terminal P23, and a fifth terminal P24.

The first terminal P21' is connected to the first external connection terminal P1 via a connection line 401. An inductor 43L corresponding to the matching element described above is connected between the connection line 401 and ground. The second terminal P22 is connected to the second external connection terminal P2 via a connection line 402.

A plurality of SAW resonators 201, 202, 203, 204, 205, and 206 are connected in series with each other between the first terminal P21' and the second terminal P22.

More specifically, one end of the SAW resonator 201 is connected to the first terminal P21' via a connection conductor 301. The other end of the SAW resonator 201 is connected to one end of the SAW resonator 202. The other end of the SAW resonator 202 is connected to one end of the SAW resonator 203 via a connection conductor 302. The other end of the SAW resonator 203 is connected to one end of the SAW resonator 204. The other end of the SAW resonator 204 is connected to one end of the SAW resonator 205 via a connection conductor 303. The other end of the SAW resonator 205 is connected to one end of the SAW resonator 206. The other end of the SAW resonator 206 is connected to the second terminal P22 via a connection conductor 304.

Further, one end of a SAW resonator 211 is connected to a connection node between the SAW resonator 202 and the SAW resonator 203, or at a predetermined position of the connection conductor 302, and the other end of the SAW resonator 211 is connected to the fourth terminal P23. The fourth terminal P23 is connected to ground via an inductor 50.

A connection node between the SAW resonator 204 and the SAW resonator 205, or a predetermined position of the connection conductor 303, is connected to one end of a SAW resonator 212, and the other end of the SAW resonator 212 is connected to the fifth terminal P24. A connection node of the SAW resonator 206 and the second terminal P22, or a predetermined position of the connection conductor 304, is connected to one end of a SAW resonator 213, and the other end of the SAW resonator 213 is connected to the fifth terminal P24. The fifth terminal P24 is connected to ground with an inductor 60 interposed therebetween.

With the configuration described above, by combining the band-pass characteristics and the attenuation characteristics of the SAW resonators 201-208, 211, 212, and 213 between the first terminal P21' and the second terminal P22, the filter unit 21 implements desired first band-pass characteristics and first attenuation characteristics outside a first pass band between the first and second terminals of the filter unit 21.

A SAW resonator 211 and longitudinally-coupled SAW resonators 231 and 232 are connected in series with each other between the first terminal P21' and the third terminals P31 and P32. With the configuration described above, by combining the band-pass characteristics and the attenuation characteristics of the SAW resonators 221, 231, and 232 between the first terminal P21' and the third terminals P31 and P32, the filter unit 21 implements desired second band-pass characteristics and second attenuation characteristics outside a second pass band between the first and third terminals of the filter unit 21. The second pass band is a frequency band different from the first pass band, and the second pass band is set in an attenuation band outside the first pass band.

Accordingly, the filter unit 21 defines and functions as a duplexer including the first terminal P21' as a common terminal, and the second terminal P22 and the third terminals P31 and P32 as individual terminals.

In the high-frequency module 101, furthermore, the inductor 43L is inductively coupled to one of the connection conductors 302, 303, and 304. By adjusting the degree of coupling between them, the first attenuation characteristics are able to be adjusted.

Here, the use of the configuration of this preferred embodiment makes it possible to adjust the band width of a frequency band in which a large attenuation is obtained in the first attenuation characteristics so that the frequency band overlaps the second pass band, and also to adjust the attenuation in the frequency band. This is achievable by adjusting the selection of the connection conductor 302, 303, or 304 to be coupled to the inductor 43L and by adjusting the degree of coupling between the connection conductor to be coupled and the inductor 43L.

Figure 8:
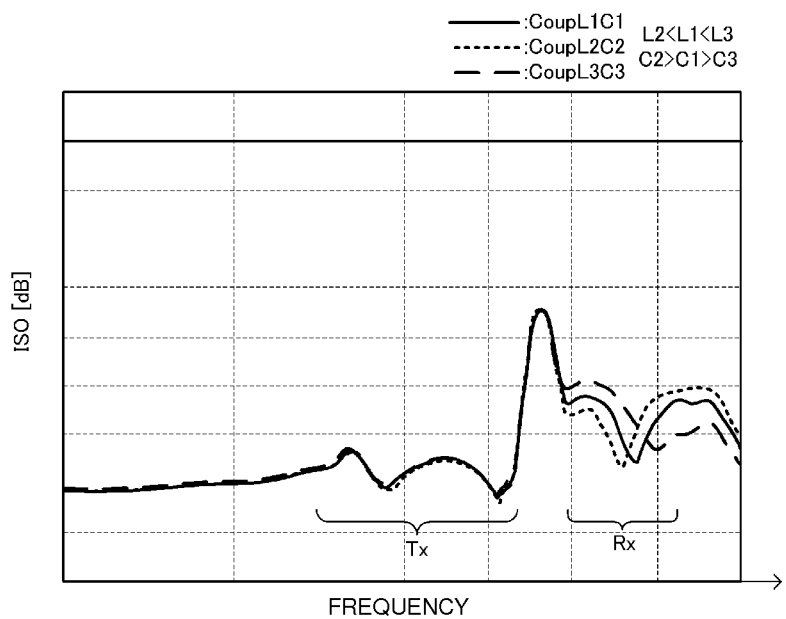
FIG. 8 is a graph illustrating a change in the isolation between a second external connection terminal and a third external connection terminal of the high-frequency module when the degree of coupling between a matching element and a connection conductor changes.

FIG. 8 is a graph illustrating a change in the isolation between a second external connection terminal and a third external connection terminal of a high-frequency module when the degree of coupling between a matching element and a connection conductor changes. The horizontal axis in FIG. 8 represents frequency, and the vertical axis in FIG. 8 represents isolation. FIG. 8 reveals that the lower the isolation, the stronger the isolation between the second and third terminals. Characteristics represented by the dotted line illustrated in FIG. 8 exhibit weaker inductive coupling and stronger capacitive coupling than characteristics represented by the solid line. Characteristics represented by the broken line illustrated in FIG. 8 exhibit stronger inductive coupling and weaker capacitive coupling than the characteristics represented by the solid line.

As illustrated in FIG. 8, by adjusting the inductive coupling and the capacitive coupling, the isolation and the isolation characteristics in the pass band of the receiving circuit Rx (on the third terminal side) are able to be adjusted. As illustrated in FIG. 8, furthermore, even if the inductive coupling and the capacitive coupling are adjusted, the isolation and the isolation characteristics in the pass band of the transmitting circuit Tx (on the second terminal side) are not substantially changed.

In the manner described above, the use of the configuration of the high-frequency module 101 appropriately adjusts the isolation characteristics between the second and third terminals. That is, the isolation characteristics between the transmitting circuit and the receiving circuit are able to be optimized.

A high-frequency module having the configuration described above can be implemented by the following example structures. In the following, example structural implementations of the high-frequency module 101 including the duplexer configuration described above are described.

First Structure

Figure 9:
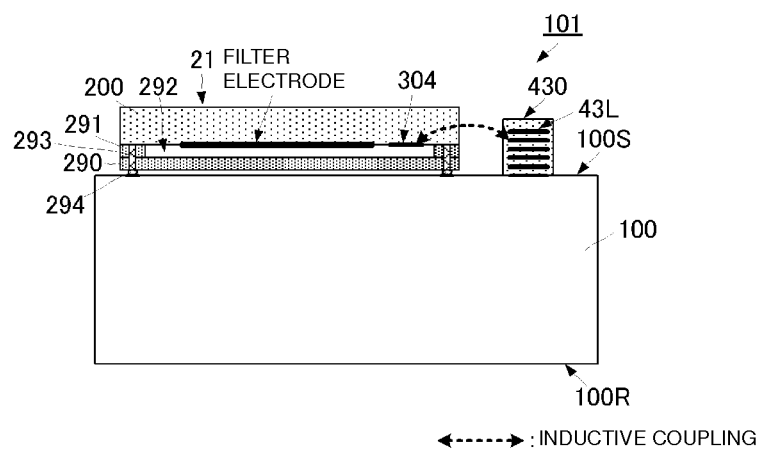
FIG. 9 is a conceptual side view illustrating the main structure of a first structure of the high-frequency module.

FIG. 9 is a conceptual side view illustrating the main structure of a high-frequency module. The high-frequency module 101 includes a multi-layer substrate 100, a filter substrate 200, a cover layer 290, a side surface cover layer 291, and a mount-type circuit element 430.

The multi-layer substrate 100 is formed preferably by stacking a plurality of dielectric layers. An electrode having a predetermined pattern is provided on a surface 100S of the multi-layer substrate 100 and in internal layers of the multi-layer substrate 100, and a wiring pattern of the high-frequency module 101, except the filter unit 21, and the inductors 50 and 60 are provided. The multi-layer substrate 100 includes external connection electrodes provided on a bottom surface 100R thereof, and the external connection electrodes define the first external connection terminal P1, the second external connection terminal P2, and the third external connection terminal described above.

The filter unit 21 includes the filter substrate 200, the cover layer 290, the side surface cover layer 291, a connection electrode 293, and a mounting electrode 294.

The filter substrate 200 preferably is a flat-plate-shaped piezoelectric substrate. The filter substrate 200 includes a first principal surface on which a filter electrode is formed. The filter electrode preferably is, for example, a so-called IDT electrode. In the manner described above, the formation of an IDT electrode on a principal surface of a piezoelectric substrate implement each of the SAW resonators described above. Electrode patterns implementing connection conductors including the connection conductor 304 are also provided on the first principal surface of the filter substrate 200. The cover layer 290 having a flat plate shape is disposed on the first principal surface side of the filter substrate 200. The cover layer 290 is composed of a flat-plate-shaped insulating material, and has the same shape as the filter substrate 200 when viewed in plan. Further, the cover layer 290 is arranged so as to overlap the filter substrate 200 when viewed in plan, and is arranged to be spaced a predetermined distance from the first principal surface of the filter substrate 200.

The side surface cover layer 291 is disposed between the first principal surface of the filter substrate 200 and the cover layer 290. The side surface cover layer 291 is also composed of an insulating material, and is located only within a range having a predetermined width extending inwardly from the outer peripheral end for the entire periphery of the filter substrate 200 and the cover layer 290, when viewed in plan. That is, the cover layer 290 preferably has a frame-shaped structure having an opening in the center thereof.

With the arrangement of the cover layer 290 and the side surface cover layer 291 in the manner described above, the region where the filter electrode is provided on the first principal surface of the filter substrate 200 is within an enclosed space 292 defined by the filter substrate 200, the cover layer 290, and the side surface cover layer 291. This improves the resonance characteristics of a SAW resonator, resulting in an accurate implementation of the desired characteristics of a filter.

The connection electrode 293 includes one end that contacts with the first principal surface of the filter substrate 200 and another end exposed on a surface of the cover layer 290 opposite to the filter substrate 200. In this case, the connection electrode 293 penetrates through the side surface cover layer 291 and the cover layer 290. The one end of the connection electrode 293 is connected to the electrode pattern on the first principal surface of the filter substrate 200.

The mounting electrode 294 is connected to the other end of the connection electrode 293, and projects from the surface of the cover layer 290 opposite to the filter substrate 200. A plurality of sets each including the connection electrode 293 and the mounting electrode 294 are disposed to implement the first terminal P21', the second terminal P22, the third terminals P31 and P32, the fourth terminal P23, and the fifth terminal P24 of the filter unit 21 described above. Note that the other end of the connection electrode 293 may be formed with a bump of solder, Au, or the like and may be connected to the mounting electrode 294 via the bump.

The configuration described above allows the filter unit 21 to have a so-called WLP (Wafer Level Package) structure, and the filter unit 21 is able to be made compact.

The filter unit 21 having the WLP structure is mounted on the top surface (mounting surface) 100S of the multi-layer substrate 100. Thus, the filter unit 21 is connected to the first external connection terminal P1, the second external connection terminal P2, and the third external connection terminal.

The inductor 43L is implemented by the mount-type circuit element 430. Specifically, the mount-type circuit element 430 includes a rectangular parallelepiped housing composed of an insulating material, and a spiral electrode defining and functioning as the inductor 43L is located in the housing. The spiral electrode is implemented by tubular linear electrodes extending along the outer periphery of the housing, portions of which are cut away, and interlayer connection electrodes. The linear electrodes in the respective layers are connected together by the interlayer connection electrodes to define a single linear electrode. Both ends of the spiral electrode are connected to external connection electrodes located on opposing end surfaces of the housing.

The mount-type circuit element 430 having the configuration described above is also mounted on the top surface (mounting surface) 100S of the multi-layer substrate 100 in a manner similar to that of the filter unit 21. Here, the connection line connecting the first terminal P21' of the filter unit 21 and the first external connection terminal P1 to each other is provided on the top surface 100S of the multi-layer substrate 100 and in the multi-layer substrate 100, and a ground electrode is provided in the multi-layer substrate 100 and is connected to a mounting land of the mount-type circuit element 430. Thus, a structure in which the inductor 43L is connected between the connection line connecting the first terminal P21' of the filter unit 21 and the first external connection terminal P1 to each other and ground is provided.

Further, the mount-type circuit element 430 implementing the inductor 43L is located in close proximity to the filter unit 21 having the WLP structure, thus achieving inductive coupling between the inductor 43L and a predetermined connection conductor of the filter unit 21.

Figure 10:
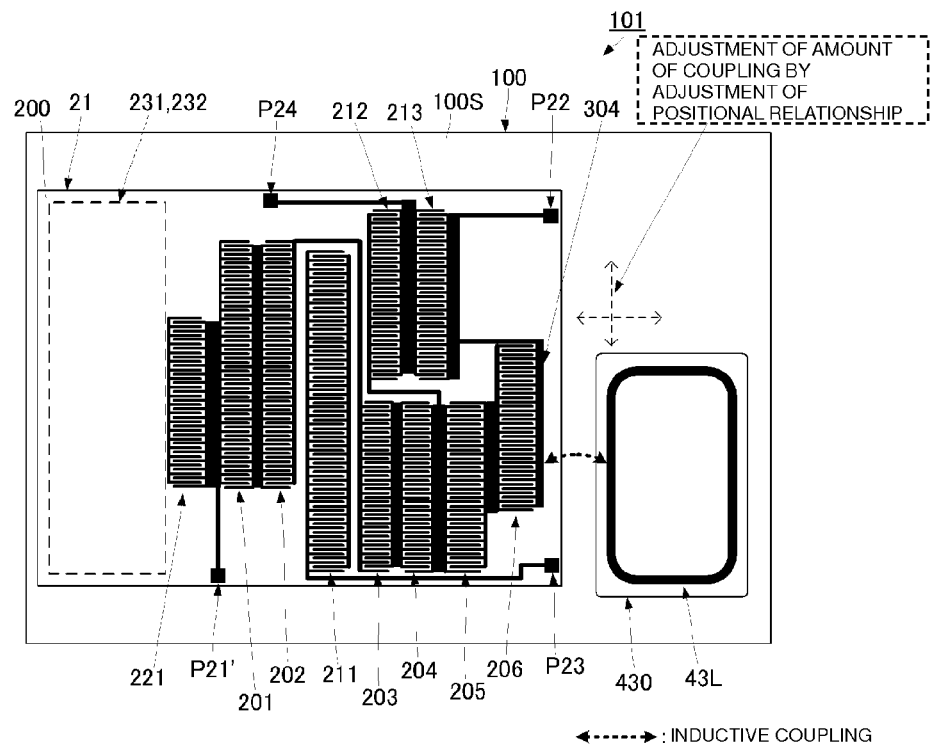
FIG. 10 is a conceptual plan view illustrating the main structure of the first structure of the high-frequency module.

The electrode pattern constituting the filter unit 21 has a structure illustrated in, for example, FIG. 10. FIG. 10 is a conceptual plan view illustrating the main structure of a high-frequency module. Specifically, on the first principal surface of the filter substrate 200, IDT electrodes constituting the SAW resonators 201-206, 211, 212, 213, and 221, IDT electrodes constituting the longitudinally-coupled SAW resonators 231 and 232, and electrode patterns constituting the respective connection conductors are provided. Further, land electrodes constituting the terminals P21', P22, P23, and P24 are also provided. The IDT electrodes, the electrode patterns constituting the connection conductors, and the land electrodes are arranged in a predetermined pattern configuration so as to implement the circuit configuration illustrated in FIG. 7.

In this case, the electrode pattern constituting the connection conductor 304 is located near a first end side of the filter substrate 200 so as to have a shape extending along the first end side.

Further, the mount-type circuit element 430 is mounted at a position in close proximity to the first end side of the filter substrate 200. Thus, the inductor 43L constituted by the spiral electrode of the mount-type circuit element 430 and the connection conductor 304 constituted by the linear electrode pattern are located in close proximity to each other, thus producing inductive coupling, as indicated by the thick dotted-line arrow in FIG. 10. The configuration described above allows the high-frequency module 101 having the desired attenuation characteristics to be implemented without using any additional element for adjusting attenuation characteristics.

Here, the arrangement position of the mount-type circuit element 430 is changed on the top surface 100S of the multi-layer substrate 100 in the directions indicated by thin broken-line arrows in FIG. 10. Thus, the distance between the inductor 43L constituted by the spiral electrode of the mount-type circuit element 430 and the connection conductor 304 constituted by the linear electrode pattern and the length of extending electrodes which oppose each other are able to be adjusted. The configuration described above makes it possible to adjust the inductive coupling between the inductor 43L and the connection conductor 304, and the adjustment of the attenuation characteristics results in an accurate implementation of the desired attenuation characteristics.

In FIG. 10, an example is illustrated in which longitudinal side surfaces of the mount-type circuit element 430 and the first end side of the filter substrate 200 are arranged in parallel or substantially in parallel to each other. Alternatively, a lateral side surface (an end surface on which an external connection electrode is provided) of the mount-type circuit element 430 and the first end surface of the filter substrate 200 may be arranged in parallel or substantially in parallel to each other. However, the parallel or substantially parallel arrangement of the longitudinal side surfaces of the mount-type circuit element 430 and the first end side of the filter substrate 200 enables stronger inductive coupling to be achieved with more ease.

In FIG. 10, furthermore, an example is illustrated in which the mount-type circuit element 430 is mounted so that the center axis of the spiral electrode is perpendicular or substantially perpendicular to the top surface 100S. Alternatively, the mount-type circuit element 430 may be mounted so that the center axis of the spiral electrode is parallel or substantially parallel to the top surface 100S.

Second Structure

Figure 11:
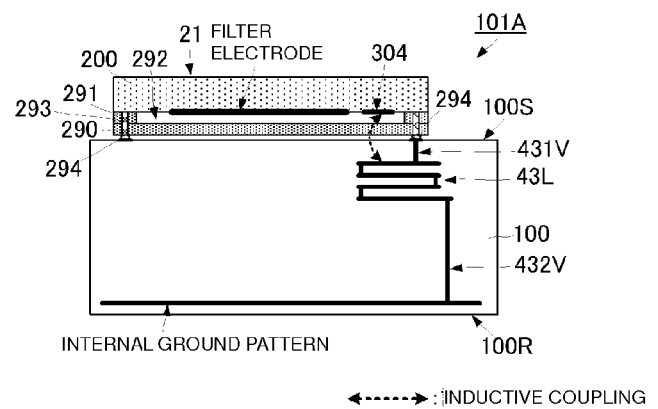
FIG. 11 is a conceptual side view illustrating the main structure of a second structure of the high-frequency module.

FIG. 11 is a conceptual side view illustrating the main structure of a high-frequency module. In a high-frequency module 101A illustrated in FIG. 11, the inductor 43L is not implemented by a mount-type circuit element but is implemented by an electrode pattern provided in the multi-layer substrate 100. The configuration of the filter unit 21 is the same as that of the high-frequency module 101 illustrated in FIG. 9 and FIG. 10, and is not described.

The inductor 43L, which is constituted by an electrode pattern of a spiral electrode, is provided in the multi-layer substrate 100. The spiral electrode is implemented by tubular linear electrodes provided in a plurality of dielectric layers constituting the multi-layer body 100, portions of which are cut away, and interlayer connection electrodes. The linear electrodes in the respective dielectric layers are connected together in the stacking direction by the interlayer connection electrodes to define a single linear electrode. With the configuration described above, a spiral electrode whose center axis extends in the stacking direction is provided. One end of the spiral electrode constituting the inductor 43L is connected to a land electrode, on which the mounting electrode 294 defining and functioning as the first terminal P21' of the filter unit 21 is mounted, via a via-conductor 431V. The land electrode is provided on the top surface 100S of the multi-layer substrate 100. The other end of the spiral electrode constituting the inductor 43L is connected to an internal ground pattern provided in the multi-layer substrate 100 near the bottom surface 100R via a via-conductor 432V.

The spiral electrode constituting the inductor 43L is also configured so that at least a portion of the spiral electrode overlaps the electrode pattern constituting the connection conductor 304 of the filter unit 21, when viewed in plan.

The configuration described above produces inductive coupling between the inductor 43L constituted by the spiral electrode in the multi-layer substrate 100 and the connection conductor 304 constituted by the linear electrode pattern located on the first principal surface of the filter substrate 200, as indicated by the thick broken-line arrow in FIG. 11. In this case, by changing the distance between the spiral electrode constituting the inductor 43L and the electrode pattern constituting the connection conductor 304 of the filter unit 21 and the area of a portion where the spiral electrode and the electrode pattern overlap, the degree of coupling between the inductor 43L and the connection conductor 304 is able to be adjusted. This enables the attenuation characteristics of the high-frequency module 101A to be adjusted in the manner similar to that of the first structure described above, resulting in a more accurate implementation of the desired attenuation characteristics.

In this preferred embodiment, furthermore, since the inductor 43L is not a mount-type circuit element, it is not necessary to provide a space for mounting the mount-type circuit element on the top surface 100S of the multi-layer substrate 100. This reduces the area of the multi-layer substrate 100 when viewed in plan, and reduces the plan-view area of the high-frequency module 101A.

Third Structure

Figure 12:
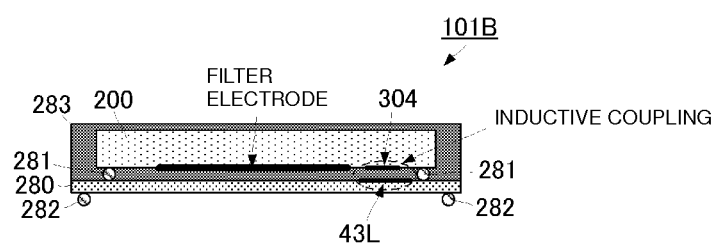
FIG. 12 is a conceptual side view illustrating the main structure of a third structure of the high-frequency module.

FIG. 12 is a conceptual side view illustrating the main structure of a high-frequency module. A high-frequency module 101B illustrated in FIG. 12 is implemented by a so-called CSP (Chip Sized Package) structure.

The high-frequency module 101B includes a filter substrate 200. As described above, a filter electrode of the filter unit 21 and electrode patterns constituting connection conductors including the connection conductor 304 are provided on the filter substrate 200.

The high-frequency module 101B further includes a filter-mounting substrate 280. The filter-mounting substrate 280 is composed of, for example, an alumina substrates, and has an area larger than the filter substrate 200 by a predetermined amount, when viewed in plan.

The filter substrate 200 is mounted on the filter-mounting substrate 280 by bump conductors 281 so that the first principal surface of the filter substrate 200 is located facing the filter-mounting substrate 280. External connection bump conductors 282 are provided on a surface of the filter-mounting substrate 280 opposite to the surface on which the filter substrate 200 is mounted.

A circuit pattern, except the filter unit 21 of the high-frequency module 101B (with a circuit configuration identical to that of the high-frequency module 101), and the inductor 43L are provided on the filter-mounting substrate 280.

A mold resin 283 is applied to the surface of the filter-mounting substrate 280 on which the filter substrate 200 is mounted. This prevents the filter electrode and the electrode patterns constituting the connection conductors from being exposed to the external environment, and improves the resonance characteristics of a SAW resonator, resulting in an accurate implementation of the desired characteristics of a filter.

Here, the electrode pattern constituting the inductor 43L which is provided on the filter-mounting substrate 280 and the electrode pattern implementing the connection conductor 304 which is provided on the filter substrate 200 are arranged so as to at least partially overlap each other, when viewed in plan. This produces inductive coupling between the electrode pattern constituting the inductor 43L and the electrode pattern implementing the connection conductor 304, as illustrated in FIG. 12. In particular, the configuration of this preferred embodiment reduces the space (distance) between the electrode pattern constituting the inductor 43L and the electrode pattern implementing the connection conductor 304, resulting in stronger inductive coupling being implemented with ease.

In addition, since the high-frequency module 101B has a CSP structure as a whole, the high-frequency module 101B is able to have a compact and low-profile design.

In the respective implementation structures described above, an example has been described in which an inductor is preferably used as a matching element. A matching element that is a capacitor can also be achieved with a similar structure. For example, in the first structure, a mount-type multi-layer capacitor element may be used. In the second structure, a capacitor may be implemented by a plurality of flat-plate electrodes provided at different layers of the multi-layer substrate 100 so as to face each other. Further, in the third structure, a capacitor may be implemented by an electrode pattern provided on the filter-mounting substrate 280.

Furthermore, as described above, it is sufficient that a connection conductor to be coupled to a matching element is configured such that one SAW resonator is interposed at least between the connection conductor and the matching element. As the number of SAW resonators interposed between them increases, the attenuation characteristics is more largely influenced. For example, in the first structure (see FIG. 9), if the positional relationship between the filter substrate 200 and the mount-type circuit element 430 is the same, the coupling of a matching element and a connection conductor between which a larger number of SAW resonators are interposed increases the influence on the attenuation characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
    a first external connection terminal;
    a second external connection terminal;
    a filter unit connected between the first external connection terminal and the second external connection terminal; and
    a matching element connected between at least one of the first external connection terminal or the second external connection terminal and the filter unit; wherein
    the filter unit includes:
        a first terminal that connects to the first external connection terminal;
        a second terminal that connects to the second external connection terminal;
        a plurality of filter elements connected in series with each other between the first terminal and the second terminal;
        a first connection unit at one end of the filter unit that connects a filter element at one end among the plurality of filter elements to the first terminal;
        a second connection unit at another end of the filter unit that connects a filter element at another end among the plurality of filter elements to the second terminal; and
        an intermediate connection unit that connects adjacent filter elements among the plurality of filter elements to each other in series; and
    at least one of the first, second, and intermediate connection units is inductively coupled or capacitively coupled to the matching element.

2. The high-frequency module according to claim 1, wherein the at least one of the first, second, and intermediate connection units and the matching element that are inductively coupled or capacitively coupled to each other are inductively coupled or capacitively coupled to each other so that an impedance outside a pass band of the filter unit changes.

3. The high-frequency module according to claim 2, wherein the at least one of the first, second, and intermediate connection units and the matching element that are inductively coupled or capacitively coupled to each other are inductively coupled or capacitively coupled to each other so that an attenuation pole frequency outside the pass band of the filter unit changes.

4. The high-frequency module according to claim 1, wherein the matching element is a series-connected matching element that is connected in series between the first external connection terminal and the first terminal or that is connected in series between the second external connection terminal and the second terminal.

5. The high-frequency module according to claim 1, wherein the matching element is a shunt-connected matching element that is connected between a connection line which connects the first external connection terminal and the first terminal to each other and ground or that is connected between a connection line which connects the second external connection terminal and the second terminal to each other and ground.

6. The high-frequency module according to claim 1, wherein the first, second, and intermediate connection units include linear conductive patterns.

7. The high-frequency module according to claim 1, further comprising a third terminal and a second filter unit, wherein
    the second filter unit is connected between the third terminal and a connection line which connects the first terminal of the filter unit to the first external terminal.

8. The high-frequency module according to claim 1, further comprising:
    a flat-plate-shaped filter substrate including a first principal surface on which an interdigitated transducer (IDT) electrode constituting the filter unit and the first, second, and intermediate connection units are provided;
    a flat-plate-shaped cover layer that faces the first principal surface of the filter substrate with a space therebetween;
    a further connection electrode having a shape that projects from the first principal surface and penetrates through the flat-plate-shaped cover layer; and
    a multi-layer substrate having the matching element mounted or formed thereon; wherein
    the filter substrate is located so that the first principal surface is oriented toward a mounting surface of the multi-layer substrate; and
    the filter substrate is connected to the multi-layer substrate via the further connection electrode.

9. The high-frequency module according to claim 8, wherein
    the matching element is a surface mount element to be mounted on the mounting surface of the multi-layer substrate;
    the first, second, and intermediate connection units are located on the first principal surface of the filter substrate near a first side of the filter substrate; and
    the surface mount element is mounted near the first side of the filter substrate.

10. The high-frequency module according to claim 9, wherein the matching element includes:
    a rectangular or substantially rectangular parallelepiped housing; and
    a spiral conductor located in the housing and having a rectangular or substantially rectangular outer peripheral shape in plan view; and
    the matching element is located so that a long side of the housing is parallel or substantially parallel to the first side of the filter substrate.

11. The high-frequency module according to claim 8, wherein
    the matching element includes a conductive pattern provide on the mounting surface of the multi-layer substrate or a conductive pattern provided in the multi-layer substrate; and
    the conductive pattern and the connection units at least partially overlap each other in plan view.

12. The high-frequency module according to claim 1, further comprising:
    a flat-plate-shaped filter substrate including a first principal surface on which an interdigitated transducer (IDT) electrode constituting the filter unit and the first, second, and intermediate connection units are provided; and a flat-plate-shaped filter-mounting substrate located on the first principal surface side of the filter substrate, the filter substrate being mounted to the filter-mounting substrate on a first principal surface side; wherein the matching element is provided on the filter-mounting substrate.

13. The high-frequency module according to claim 1, wherein the plurality of filter elements include a plurality of surface acoustic wave resonators.

14. The high-frequency module according to claim 1, wherein each of the plurality of filter elements includes a band-pass characteristic.

15. The high-frequency module according to claim 1, wherein the matching element includes at least one of an inductor and a capacitor.

16. The high-frequency module according to claim 1, wherein the high-frequency module has combined transmission characteristics in which transmission characteristics of a main propagation path extending through the filter unit and transmission characteristics of a sub-propagation path extending through a further coupling unit are combined.

17. A duplexer comprising the high-frequency module according to claim 1.

18. The high-frequency module according to claim 1, wherein the filter unit has a wafer level package structure.

19. The high-frequency module according to claim 1, wherein the high-frequency module has a chip sized package structure.

* * * * *

UNITED STATES PATENT AND TRADEMARK OFFICE
CERTIFICATE OF CORRECTION

| | | |
|---|---|---|
| PATENT NO. | : 9,602,078 B2 | |
| APPLICATION NO. | : 14/878082 | |
| DATED | : March 21, 2017 | |
| INVENTOR(S) | : Morio Takeuchi | |

It is certified that error appears in the above-identified patent and that said Letters Patent is hereby corrected as shown below:

On the Title Page

(63) Continuation of Application No. should read:
PCT/JP2014/060246, filed on April 9, 2014

Signed and Sealed this
First Day of May, 2018

Andrei Iancu
*Director of the United States Patent and Trademark Office*